US006859377B2

(12) United States Patent
Yamagata (10) Patent No.: US 6,859,377 B2
(45) Date of Patent: Feb. 22, 2005

(54) DYNAMIC ASSOCIATIVE MEMORY DEVICE

(75) Inventor: Tadato Yamagata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/668,310

(22) Filed: Sep. 24, 2003

(65) Prior Publication Data

US 2004/0136216 A1 Jul. 15, 2004

(30) Foreign Application Priority Data

Jan. 14, 2003 (JP) ........................................ 2003-005791

(51) Int. Cl.[7] ............................................ G11C 15/00
(52) U.S. Cl. ....................................... 365/49; 365/203
(58) Field of Search ................................... 365/49, 203

(56) References Cited

U.S. PATENT DOCUMENTS

| | | | |
|---|---|---|---|
| 5,126,968 A | 6/1992 | Hamamoto et al. | |
| 5,146,300 A | 9/1992 | Hamamoto et al. | |
| 5,319,589 A | 6/1994 | Yamagata et al. | |
| 6,262,907 B1 * | 7/2001 | Lien et al. ..................... | 365/49 |

FOREIGN PATENT DOCUMENTS

JP          5-298891         11/1993

OTHER PUBLICATIONS

IEEE J.S.S.C. vol. 27. No. 12, Dec. 1992 pp. 1927, Tadato Yamagata, et al., "A 288–kb Fully Parallel Content Addressable Memory Using a Stacked–Capacitor Cell Structure".

IEICE Transactions on Electronics, vol. E76–C, No. 11, Nov. 1993, pp. 1657, Tadato Yamagata et al., "A Bitline Control Circuit Scheme and Redundancy Technique for High–Density Dynamic Content Addressable Memories".

IEICE Transactions on Electronics, vol. E77–C, No. 8, Aug. 1994, pp.1377, Takeshi Hamamoto, et al. "A Flexible Search Managing Circultry for High–Density Dynamic CAMs".

Proceedings of the IEEE 1991, May 12–15, 1991, "Custom Integrated Circuits Conference", Town & Country Hotel San Diego, California.

* cited by examiner

Primary Examiner—Hoai Ho
(74) Attorney, Agent, or Firm—McDermott Will & Emery LLP (57) ABSTRACT

A dynamic associative memory device comprising memory cells each of that including: a capacitor connected to one of the bit lines through first transmission gate capable of being switched to ON by an activation of a word line, and having a cell plate supplied with a source voltage; at least one second transmission gate provided in series between the bit lines, capable of being switched to ON by a memory node potential at an opposite side of a source voltage supply-side of the capacitor; and a initializing circuit for controlling the memory node potential upon receiving a reset signal so that at least one of the second transmission gates is switched to OFF.

5 Claims, 9 Drawing Sheets

DYNAMIC ASSOCIATIVE MEMORY DEVICE

BACKGROUND OF THE INVENTION

1) Technical Field of the Invention

The present invention relates to a dynamic associative memory device having dynamic associative memory cells.

2) Description of Related Arts

A variety of dynamic associative memory devices called as Content Addressable Memory devices, that is referred to simply as "CAM" device hereinafter, are well-known in the art. The CAM device is useful in an application used for matching a search data input from an external device with a pile of data stored therein, and for detecting the address of the matched data, if any. In particular, a full parallel CAM device is highly expected in technical fields of the artificial intelligence and the database system, where a frequent data matching-detecting process is required. In the fully parallel CAM device, substantial all of stored data in the dynamic associative memory cells, that is also called as "the dynamic memory cells" or "the memory cell" hereinafter, are compared with the search data in parallel by each bit line. An example of the fully parallel CAM device having a plurality of the memory cells with a data matching-detecting function is disclosed in a commonly assigned JP 5-298891 (A), which has a corresponding U.S. Pat. No. 5,319,589, which is totally incorporated herein by reference.

The dynamic memory cell disclosed in the aforementioned U.S. patent is commonly used in the dynamic associative memory device having the data matching-detecting function, which is well known and disclosed in the report entitled "Proceedings of the IEEE 1991 CUSTOM INTEGRATED CIRCUITS CONFERENCE ('91, PAPER# 10.3)" too. The memory cell includes a pair of data-storing capacitors having a cell plate supplied with a potential depending on a source voltage, and a matching-detecting circuit for matching the searching data with data stored in data-storing capacitors, and for detecting the address of the matched data, if any.

In particular, the dynamic memory cell of the memory device includes first and second data-storing capacitors of which cell plate voltages are increased in accordance with a source voltage rising from 0 volt to Vcc/2 volt. Also, the memory cell includes a first transistor provided between the first data-storing capacitor and a bit line BL and a second transistor provided between the second data-storing capacitor and another bit line /BL, which are switching in accordance with an activation of a word line. The pair of the bit lines BL and /BL can be defined hereinafter as to have signal potentials opposite to each other (high or low level potential) during a writing process for the memory cell. The memory cell further includes third and fourth transistors connected in series and between the bit lines BL and /BL, switching in response to the potentials each of first and second memory nodes provided between the first transistor and the first data-storing capacitor, and between the second transistor and the second data-storing capacitor, respectively. Further, the memory cell includes a fifth transistor diode-connected between a node provided between the third and fourth transistors and a match line. During the matching-detecting process, current runs in the match line, indicating that the searching datum is matched with the data stored in the data-storing capacitors, if any.

When the source voltage is supplied to the memory cell, the potentials of the first and second memory nodes are raised in accordance with the cell plate voltage (Vcc/2 volt). This triggers the third and fourth transistors to bring them in ON-state, thus, a through current runs between the bit lines BL and /BL via the third and fourth transistors. In this circumstance, the writing process cannot fully charge the first or second data-storing capacitor with electrons, also cannot fully discharge the second or first data-storing capacitor in a sufficient manner as designed. Therefore, for example, the data-storing capacitor intended to charge to show a high level potential may insufficiently be charged so that it may be misread as having a low level potential.

One of the embodiments of the present invention is to provide a memory device eliminating the possibility of malfunctions, which can be arisen, for example, in a data writing process because the through current runs between the bit lines BL and /BL When the source voltage is supplied to the memory cell.

SUMMARY OF THE INVENTION

The dynamic associative memory device according to one of the embodiments of the present invention includes a plurality of memory cells. Each of the memory cells connects a word line and a pair of first and second bit lines, BL and /BL. The memory cell includes a data-storing capacitor connected to the bit line BL or /BL through first transmission gate capable of being switched to ON-state in accordance with an activation of the word line, and having a cell plate supplied with a source voltage. The memory cell also includes at least one of second transmission gate provided in series between the bit lines BL and /BL, capable of being switched to ON-state in response to a memory node potential at an opposite side of a source voltage supply-side of the data-storing capacitor. The memory device further comprises a memory cell initializing circuit for controlling the memory node potential upon receiving a reset signal so that at least one of the second transmission gates is switched to OFF-state.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given hereinafter and accompanying drawings which are given by way of illustration only, and thus are not limitative of the present invention and wherein.

DETAILED DESCRIPTION OF THE PREFERRED EMBODIMENTS

The dynamic associative memory device according to the present invention includes an array of memory cells. Each of the memory cells includes first and second data-storing capacitors both of which cell plates are applied with a voltage (Vcc/2 volt) depending on a source voltage (Vcc volt). Also, the memory device includes a matching-detecting circuit for matching a searching data with data stored in the data-storing capacitors, and for detecting an address of a matched data, if any.

The memory cell includes first and second transistors, as transmission gates, provided between the first data-storing capacitor and a bit line BL (first bit line), and between the second data-storing capacitor and another bit line /BL (second bit line), and both of them switch in accordance with an activation of a word line. The pair of the bit lines BL and /BL can be defined hereinafter as to have signal potentials opposite to each other (high or low level potential) during a writing process for the memory cell. The memory device further includes third and fourth transistors, as transmission gates, connected in series and between the bit lines BL and /BL, switching in response to the potentials of first and second memory nodes provided between the first transistor and the first data-storing capacitor, and between the second transistor and the second data-storing capacitor, respectively. Further, the memory device includes a fifth transistor, as a transmission gate, diode-connected between the source of the third transistor (or the drain of the fourth transistor) and a match line.

The dynamic associative memory device according to the present invention further includes a memory-cell initializing circuit for correcting the potential of the memory nodes to reduce enough, preferably to 0 volt, to make one of the transistors in OFF-state upon receiving the reset signal generated externally or internally within the memory device. This eliminates possibility of malfunctions, which can be arisen, for example, in a data writing process when the source voltage is supplied to the cell plate.

Next, referring to the attached drawings, the details of first to third embodiments according to the present invention will be described hereinafter.

First Embodiment

Figure 1:
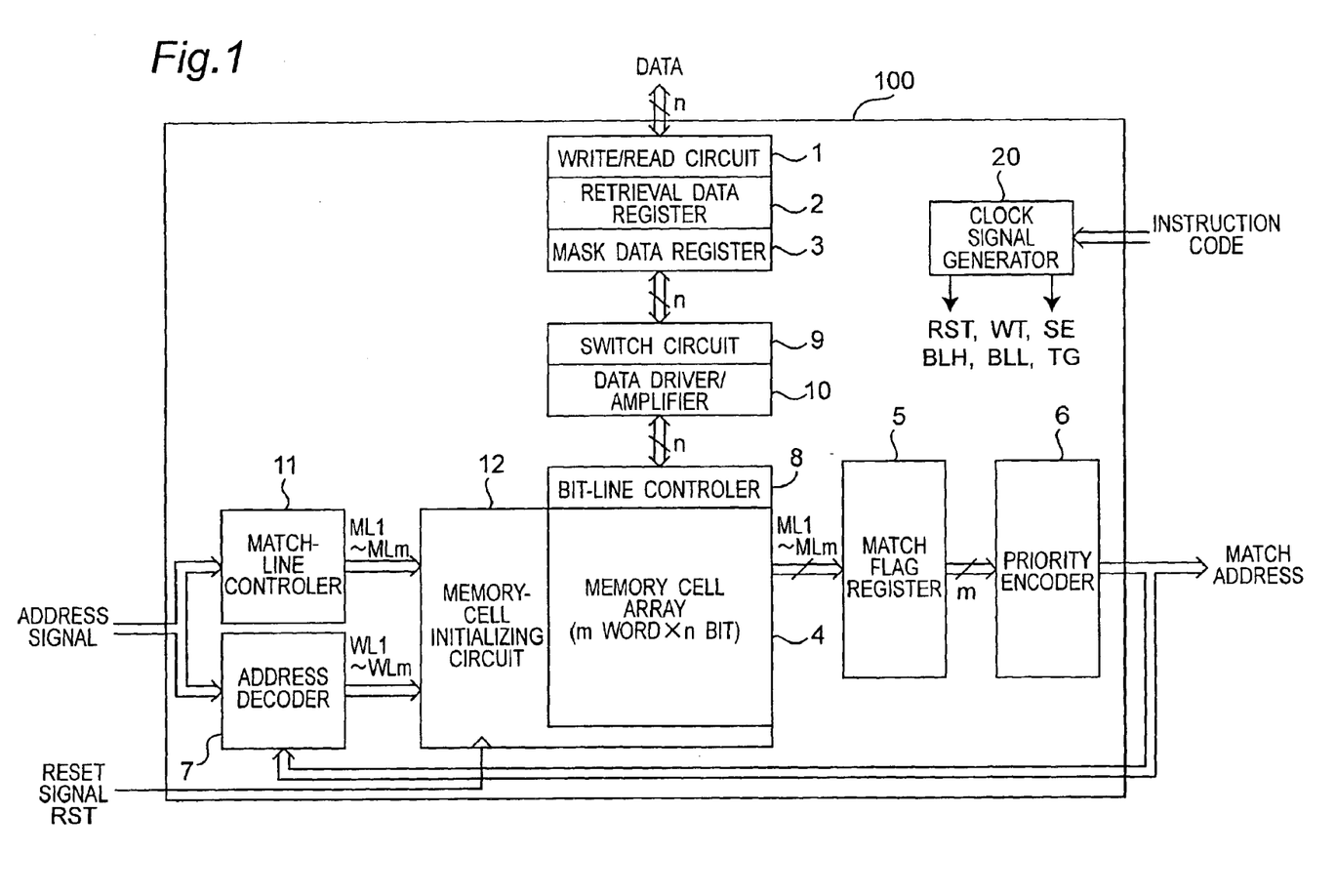
FIG. 1 is a block diagram of a dynamic associative memory device according to a first embodiment of the present invention.

FIG. 1 is a block diagram of the dynamic associative memory device 100 according to the first embodiment. The dynamic associative memory device 100 which is similar to that disclosed in the U.S. Pat. No. 5,319,589 which is incorporated herein by reference, except that the dynamic associative memory device 100 includes a memory-cell initializing circuit 12. The memory-cell initializing circuit 12 is activated upon receiving a reset signal from an external device When the source voltage is supplied to the memory cell. Therefore, a further description will be focused on the structure and the operation of the memory-cell initializing circuit 12 with a brief description of the other components of the dynamic associative memory device 100.

The dynamic associative memory device 100 includes a memory cell array 4 (m-word by n-bit memory cells) and a bit-line controller 8 for controlling the potentials of the bit lines in the memory cell array 4. A clock signal generator 20 decodes a variety of instruction codes input from an external device and then generates a clock signal and some control signals to be supplied to associated elements.

Also, an address signal is input both to an address decoder 7 and a match-line controller 11. Then, the address decoder 7 sets one of the word lines WL1 to WLm selected by the address signal to high level potential. Also, the match-line controller 11 sets all match lines ML1 to MLm to high level potential for matching and detecting the searching data.

Receiving the reset signal RST input from the external device, the memory-cell initializing circuit 12 sets all word lines WL1 to WLm of the memory cells to high level potential and sets the bit lines BL and /BL to the low and high level potentials, respectively, when the source voltage has been supplied to the memory cells. Thus, all memory cells are written with the "L" data. The detail structure of the memory-cell initializing circuit 12 will be described hereinafter.

In the retrieving process, the n-bit searching data externally input are stored within a retrieval data register 2 through a write/read circuit 1. The searching data are input to the memory cell array 4 through a mask data register 3, a switch circuit 9, a data driver/amplifier 10, and a bit-line controller 8. As will be described later, the memory cell array 4 outputs the high level signal as the potential of the match line ML if the input n-bit searching data are matched with the n-bit data on the same match lines ML, i.e., the same word lines WL. Also, the memory cell array 4 outputs the low level signal as the match line ML if the input n-bit searching data fail to match with the n-bit data. Thus, the memory cell array 4 outputs the high or low level signals for each of the match lines ML to a match flag register 5.

The match flag register 5 stores and holds m-bit data containing the signal levels of all match lines ML1 to MLm output from the memory cell array 4. Upon receiving the m-bit data from the match flag register 5, a priority encoder 6 selects one of the match lines having the high level signal according to a predetermined priority order, and outputs a match address signal of the selected match line.

Figure 2:
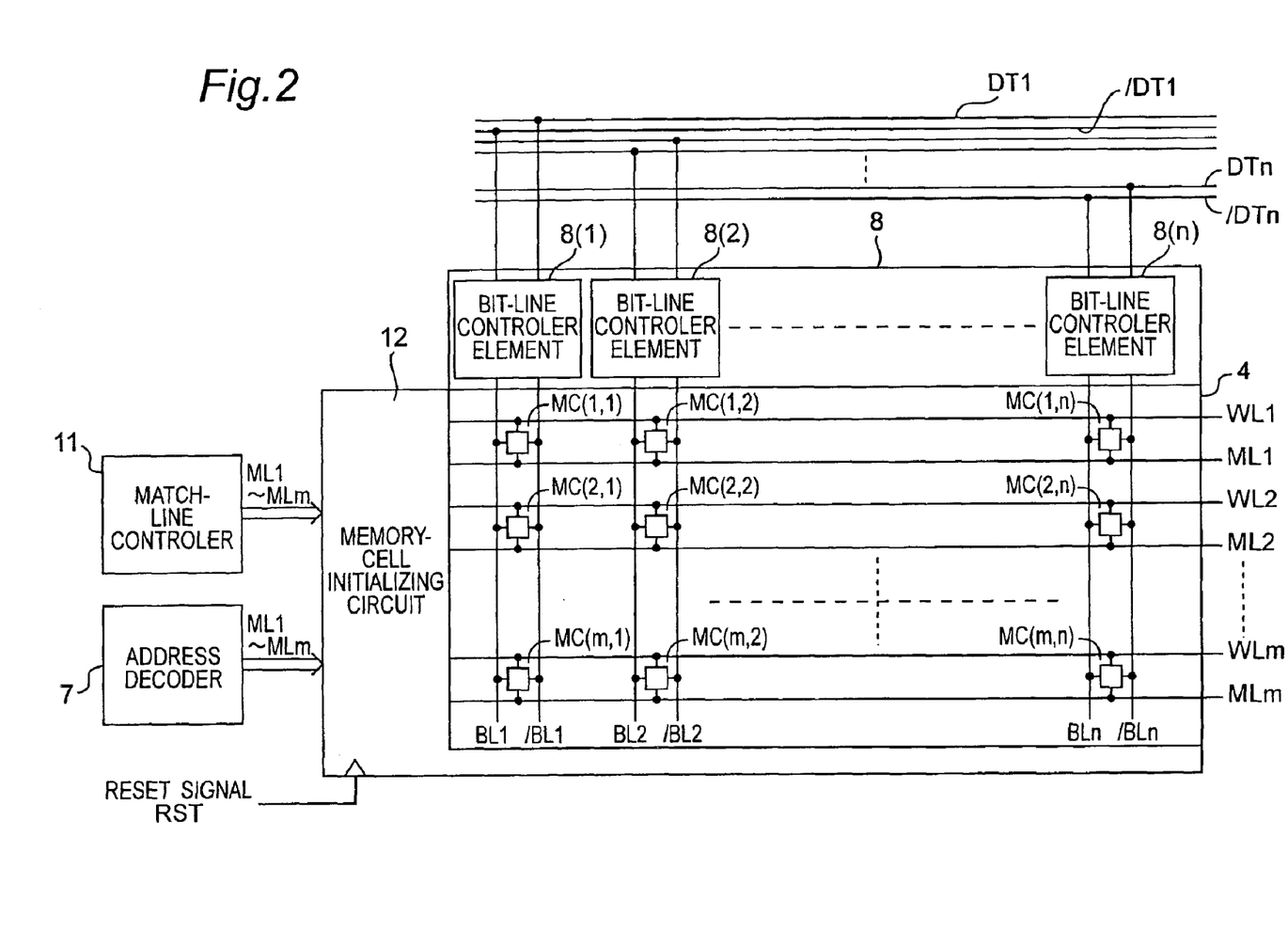
FIG. 2 is a circuit diagram illustrating the structure of the memory cell array and the bit-line controller shown in FIG. 1.

FIG. 2 is a circuit diagram illustrating a structure of the memory cell array 4 and the bit-line controller 8 shown in FIG. 1. As illustrated in FIG. 2, the memory cell array includes m-word by n-bit memory cells MC(i,j), wherein "i" and "j" represent integers from 1 to m and 1 to n, respectively. Each of the memory cells MC has the same structure. The word-line signals WLi output from the address decoder 7 and also the match-line signals MLi output from the match-line controller 7 are both input to each of the memory cells MC(i,l) to MC(i,n) arranged in the i-th line. The bit-line controller 8 includes a series (n-pieces) of bit-line controller elements 8(1) to 8(n). One of the bit-line controller elements 8(j) among the bit-line controller elements 8(1) to 8(n) controls signal levels of the memory cells MC(1,j) to MC(M,j) of the bit lines BLj and /BLj.

Figure 3:
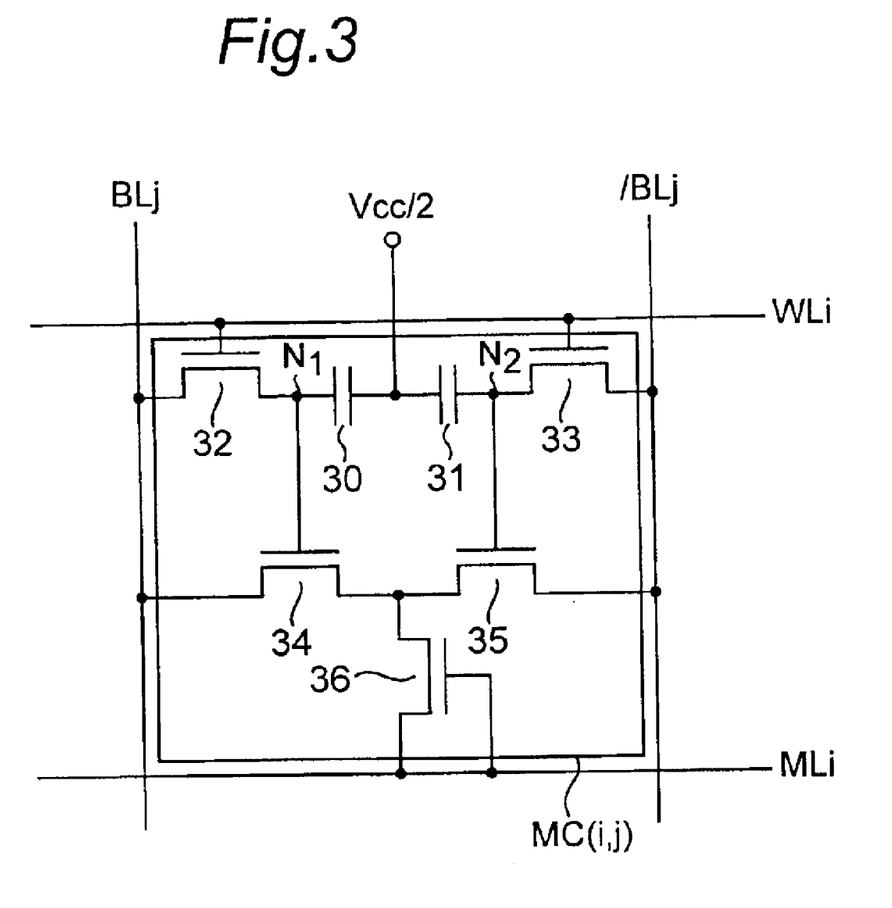
FIG. 3 is a circuit diagram illustrating the structure of each dynamic memory cell having a matching-detecting function of data.

FIG. 3 is a circuit diagram illustrating a structure of each memory cell MC(i,j), including data-storing capacitors 30, 31 with a cell plate potential of a half of the source voltage (Vcc/2 volt), and a matching detecting circuit for the data stored in the capacitors. The memory cell MC(i,j) stores the data in the data-storing capacitors 30, 31 connected in serial to each other. The common node of the data-storing capacitors 30, 31 is applied with the cell plate potential of Vcc/2 volt. The other node, i.e., a memory node $N_1$ of the data-storing capacitor 30 is connected to a source of the NMOS transistor 32. The NMOS transistor 32 has a drain connected to the bit line BLj and a gate connected to the word line WLi, and functions as a transmission gate. Meanwhile, the other node, i.e., a memory node $N_2$ of the data-storing capacitor 31 is connected to a drain of the NMOS transistor 33. The NMOS transistor 33 has a source connected to the bit line /BLj and a gate connected to the word line WLi and functions as a transmission gate. The above-mentioned data-storing capacitors 31, 32 and NMOS transistors 32, 33 together define the dynamic-type memory cell.

The memory cell MC(i,j) further includes a pair of NMOS transistors 34, 35 of which gates are connected to the memory nodes $N_1$, $N_2$ of the data-storing capacitors 31, 32, respectively. Each of the NMOS transistors 34, 35 functions as a transmission gate.

The NMOS transistor 34 has a drain connected to the bit line BLj and a source connected to a drain of the NMOS transistor 35 functioning as a transmission gate, of which drain is connected to the bit line /BLj. Also, the memory cell MC(i,j) includes another NMOS transistor 36 having a drain connected to the source of the NMOS transistor 34 and the drain of the NMOS transistor 35. The gate and source of the NMOS transistor 36 are connected, i.e., diode-connected to the match line MLi.

Next, the operations for writing data into and reading stored data from the memory cell MC(i,j) so structured will be described hereinafter.

Firstly, in order to write data in the memory cell MC(i,j), the match line MLi is applied with the low level potential so that the NMOS transistor 36 is switched off, i.e., into OFF-state. Then, while the word line WLi is applied with the high level potential, the bit line BLj is applied with the potential (high or low level potential) corresponding to that used for writing data, and the bit line /BLj is applied with the potential of the opposite potential. This causes the data-storing capacitors 30, 31 to store the potentials of the bit lines BLj and /BLj, respectively. Lastly, the word line WLi is applied with the low level potential to complete the writing process.

Also, the reading process is achieved as follows. The bit lines BLj and /BLj are applied with the low level potential and the word line WLi is applied with the low level potential. Then, the match line MLi is applied with the high level potential. For example, if the data-storing capacitor 30 is charged with electrons, the transistor 34 is switched into ON-state, then the bit line BLj is switched to the high level potential, while the bit line /BLj is maintained at the low level potential. On the other hand, if the data-storing capacitor 31 is charged with electrons, the transistor 35 is switched into ON-state, then the bit line /BLj is switched to the high level potential, while the bit line BLj is maintained at the low level potential.

A matching and detecting process for matching the search data with stored data and detecting thereof is conducted as follows. Firstly, the bit lines BLj and /BLj and the match lines MLi are applied with the high level potential. For example, while the data-storing capacitor 30 is charged with electrons, the bit lines BLj and /BLj are applied with the high level potential and the low level potential, respectively. However, the transistors 34, 35 are maintained in OFF-state, thus, no current flows from the match line MLi to the bit lines BLj so that the potential of the match line MLi is also maintained high level.

On the other hand, the bit lines BLj and /BLj are applied with the low level potential and the high level potential, respectively. The transistor 34 is switched into ON-state while the transistor 35 is kept in OFF-state. To this end, the current flows (electrons are discharged) from the match line MLi to the bit lines BLj through the transistors 34, 36 and the potential of the match line MLi changes from high to low level. Therefore, it can be detected whether the search data is matched with the data stored in the memory cell MC by applying potential signals corresponding to the search data signal to the bit lines BLj and /BLj, and by monitoring the change of the match lines MLi.

The aforementioned writing, reading, and matching-detecting processes all require one of the transistors 34, 35 with the gate having the high (or low) level potential, and the other one of them with the gate having the low (or high) level potential. However, when the source voltage is applied to the memory device 100, the potentials of the cell plates are raised by Vcc/2 volt, which also raises the potentials of the memory nodes N1, N2 due to the coupling effect of the data-storing capacitors 30, 31 so that the gate potentials of the transistors 34, 35 increase up to or close to Vcc/2 volt. Such high gate potentials inhibit the electrical isolation between the sources and drains of both of the transistors 34, 35, therefore, a through current may flow between the bit lines BLj and /BLj through the transistors 34, 35. In particular, even if the bit-line controller provides the bit line BLj with 5V and the bit line /BLj with 0 volt, the bit lines BLj and /BLj may have the actual potential of about 4 volts and 1 volt, respectively. Thus, such inappropriate potentials of the bit lines BLj and /BLj may cause the insufficient electrons to be charged in the data-storing capacitors 31, 32 by the data writing process. Also, the data reading process may allows the current running from the transistor 36 to both of the transistors 34, 35, thereby reading inaccurate data. Further, the matching and detecting process with such inappropriate potentials of the bit lines fails to match and detect the search data among the data stored in the memory cells because the current flows into both of the bit lines BLj and /BLj.

To address the aforementioned drawbacks, the dynamic associative memory device 100 according to the present embodiment further includes a memory-cell initializing circuit 12 provided between the address decoder 7 and the memory cell array 4. The memory-cell initializing circuit 12 resets at least one potential of the memory nodes of the data-storing capacitors 30, 31 to be 0 volt upon receiving the reset signal RST, so that the concurrent electrical connections (ON-states) of both of the transistors 34, 35 are prevented, thereby inhibiting the through current between the bit lines BLj and /BLj.

Figure 4:
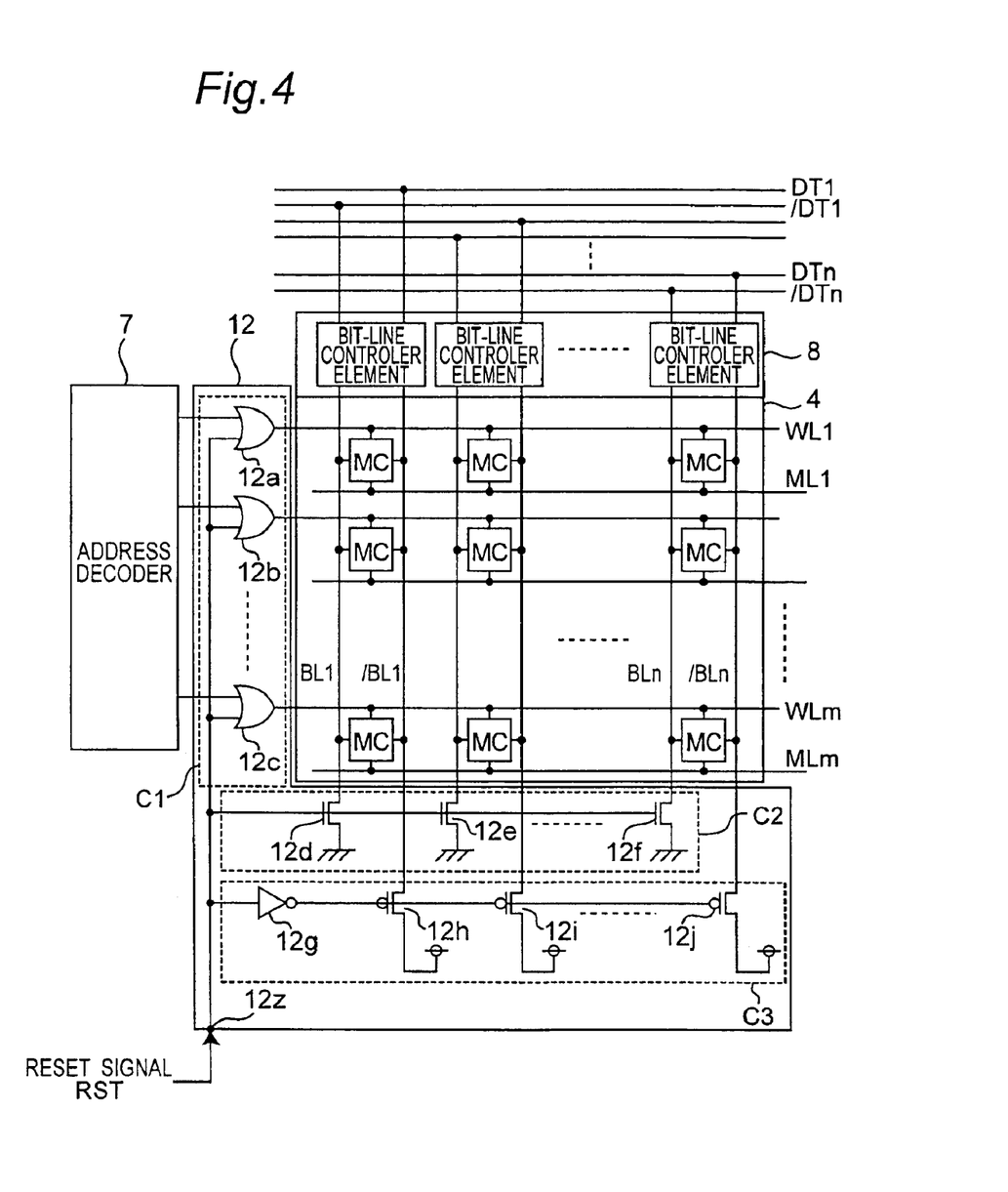
FIG. 4 is a circuit diagram showing the structure of the memory-cell initializing circuit.

FIG. 4 is a circuit diagram showing the detailed structure of the memory-cell initializing circuit 12. The memory-cell initializing circuit 12 includes a word-line WL switching circuit C1, a bit-line BL switching circuit C2, and another bit-line /BL switching circuit C3.

The word-line WL switching circuit C1 includes a plurality (m pieces) of OR gates with two inputs 12a, 12b, . . . , and 12c. One of inputs of each OR gate is connected to the corresponding one of the outputs WL1 to WLm of the address decoder 7, and the other one of inputs of each OR gate is connected to a reset signal input terminal 12z. When the reset signal with the high level potential is externally input to the reset signal input terminal 12z, all of the word lines WL1 to WLm are switched by m pieces of OR gates to have the high level potential.

The bit-line BL switching circuit C2 includes a plurality (n pieces) of NMOS transistors 12d, 12e, . . . , and 12f. Each of the NMOS transistors has a drain connected to the corresponding one of the bit lines BL, a gate connected to the reset signal input terminal 12z, and a source connected to the ground. When the reset signal RST with the high level potential is externally input to the reset signal input terminal 12z, all of the bit lines BL1 to BLn are switched to the ground level.

The bit-line /BL switching circuit C3 includes an inverter 12g and a plurality (n pieces) of PMOS transistors 12h, 12i, . . . and 12j. Each of the PMOS transistors has a drain connected to the corresponding one of the bit lines /BL, a gate connected to the reset signal input terminal 12z through the inverter 12g, and a source connected to the source voltage (Vcc volt). When the reset signal with the high level signal is externally input to the reset signal input terminal 12z, and then inverted by the inverter 12g to output low level signal to the PMOS transistors 12h, 12i, . . . and 12j. Thus, while the PMOS transistors are applied with the high level potential, each of them supplies the source voltage (Vcc volt) to the bit lines /BL.

Figure 5:
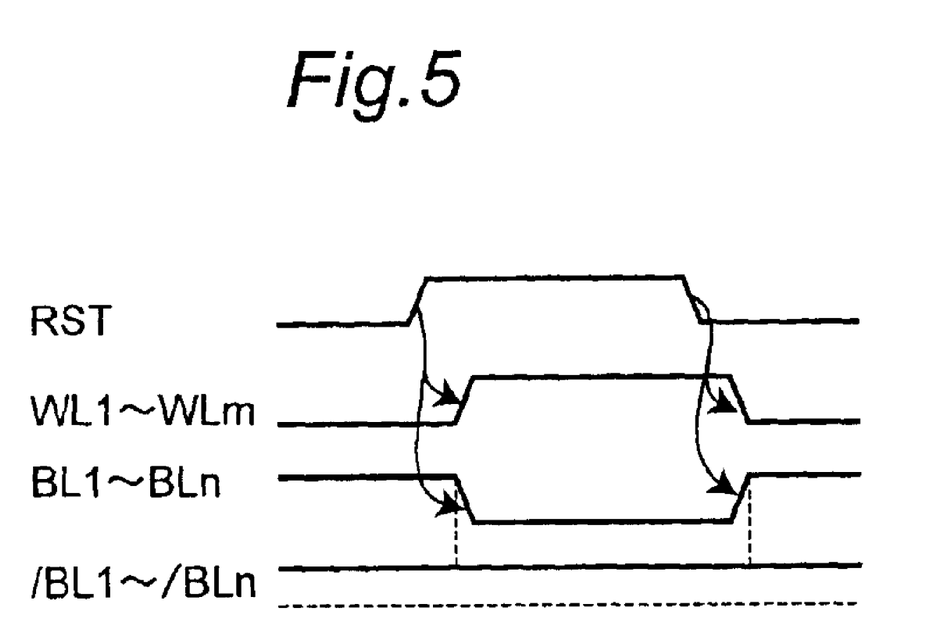
FIG. 5 is a timing chart illustrating potential levels of the word lines, the bit lines and the reset signal of the memory-cell initializing circuit.

FIG. 5 is a timing chart illustrating potential levels of the word lines WL, the bit lines BL and /BL in response to the reset signal RST with the high level potential after supplied with the source voltage. As shown, once the reset signal RST is switched to the high level potential, all of the word lines WL1 to WLm are also switched to the high level potential while all of the bit lines BL1 to BLn are set to the low level potential. The bit lines /BL1 to /BLn are maintained at the high level potential. To this end, the data-storing capacitor 30 shown in FIG. 3 is fully discharged and the data-storing capacitor 31 is completely charged with electrons. Although the memory node potential is generally increased when supplied with the source voltage, according to the memory device of the present embodiment, the memory node potential can be corrected by writing the datum of the low level potential in the memory cell as described above. Therefore, the through current between the bit lines BL and /BL is prevented so that the subsequent writing, reading, and matching-detecting processes can be achieved in a proper and precise manner.

Second Embodiment

Figure 6:
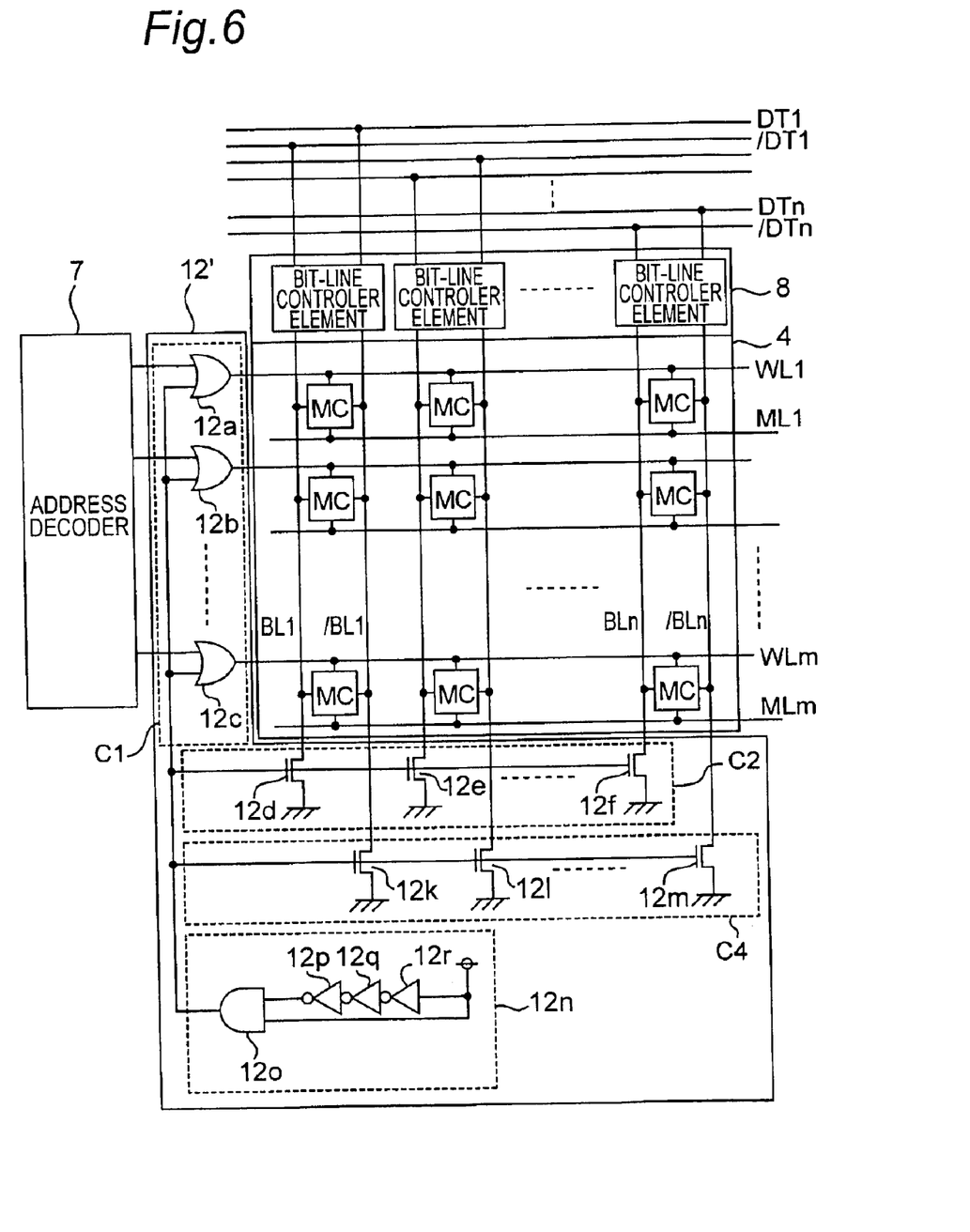
FIG. 6 is a circuit diagram showing the structure of another memory-cell initializing circuit of the dynamic associative memory device of a second embodiment.

FIG. 6 is a circuit diagram showing the detailed structure of another memory-cell initializing circuit 12' of the dynamic associative memory device of the second embodiment. In FIG. 6, the same reference numerals are used to denote the same components of the first embodiment shown in FIG. 1, of which description will not be duplicated herein.

The memory-cell initializing circuit 12' of the second embodiment includes another bit-line /BL switching circuit C4 instead of the corresponding one C3 of the first embodiment, and also includes a reset-signal generating circuit 12n outputting a reset signal When the source voltage is supplied to the memory cells.

The bit-line /BL switching circuit C4 includes a plurality (n pieces) of NMOS transistors 12k, 12l, . . . and 12m. Each of the NMOS transistors has a drain connected to the corresponding one of the bit lines /BL, a gate connected to the reset signal input, and a source connected to the ground. Thus, each of the NMOS transistors connects all of the bit-lines /BL to the ground in response to the reset signal with the high level potential input to the gate thereof.

The reset-signal generating circuit 12n has an AND gate 12o with two inputs. One of inputs of the AND gate is connected to the power source, and the other one of inputs is also connected to the power source through an odd number of inverters, e.g., three of inverters 12p, 12q, and 12r. The reset-signal generating circuit 12n is designed so as to output the reset signal with the high level potential for a time period corresponding to the total delay time of the three inverters 12p, 12q, and 12r. Also, it should be noted that a delay circuit or a timer may be provided between the power source and the reset-signal generating circuit 12n in order to await a desired time period after the connection to the power source, and then to supply the source voltage to the reset-signal generating circuit 12n.

Figure 7:
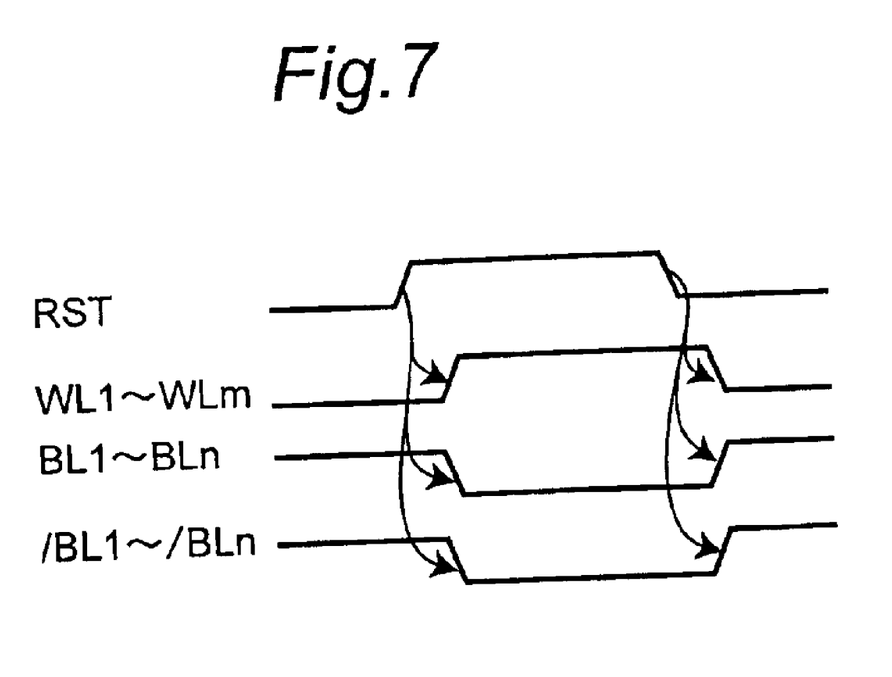
FIG. 7 is a timing chart illustrating potential levels of the word lines, the bit lines, and the reset signal.

FIG. 7 is a timing chart illustrating potential levels of the word lines WL, the bit lines BL and /BL in response to the pulsed reset signal RST with the high level potential after applied with the source voltage. As shown, once the reset signal RST is switched to high level, all of the word lines WL1 to WLm are also switched to the high level potential while all of the bit lines BL1 to BLn and /BL1 to /BLn are set to the low level potential. Therefore, according to the memory device of the second embodiment, the data-storing capacitors 30, 31 of the memory cell MC(i,j) shown in FIG. 3 are fully discharged, and the transistors 34, 35 connecting the bit lines BL and /BL are set to be in OFF-states. This further secures the inhibition of the through current between the bit lines BL and /BL.

Third Embodiment

Figure 8:
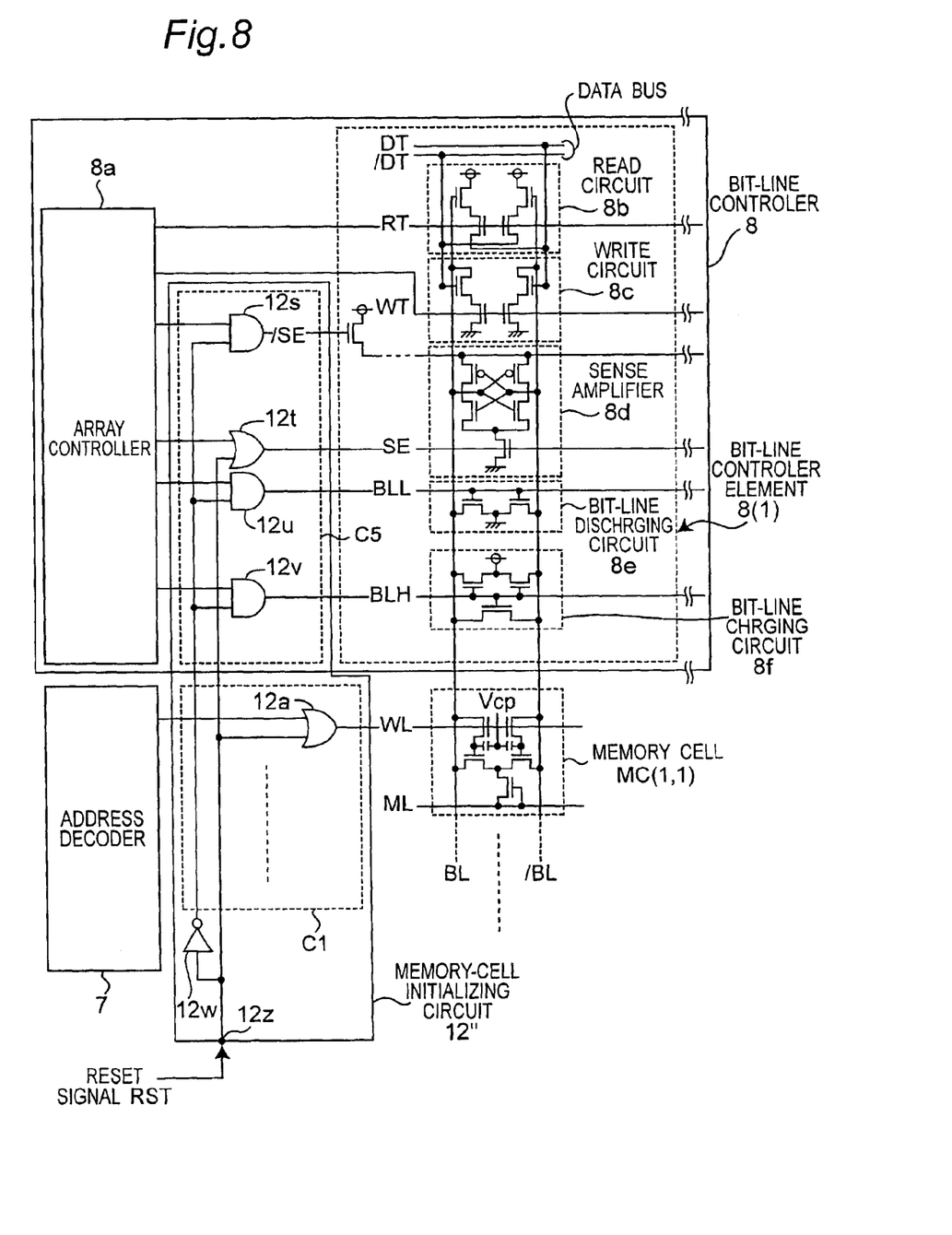
FIG. 8 is a circuit diagram showing the structure of another memory-cell initializing circuit of the dynamic associative memory device of a third embodiment.

FIG. 8 is a circuit diagram showing a detailed structure of another memory-cell initializing circuit 12" of the dynamic associative memory device of the third embodiment. In FIG. 8, the same reference numerals are used to denote the same components of the first embodiment shown in FIG. 1, of which description will not be duplicated herein.

The memory-cell initializing circuit 12" of the third embodiment has no bit-line BL switching circuit C2, and another bit-line /BL switching circuit C3 unlike the memory-cell initializing circuit 12 of the first embodiment. Instead, the memory-cell initializing circuit 12" includes a sense-amplifier control circuit C5 with a sense amplifier for controlling a plurality of bit-line controller elements 8(1) to 8(n) in response to the reset signal with the high level potential.

Before describing the structure of the sense-amplifier control circuit C5, the bit-line controller elements 8(1) to 8(n) will be firstly described herein. Each element of the bit-line controllers has the same structure as others. FIG. 8 illustrates the bit-line controller element 8(1) only, and eliminates other elements 8(2) to 8(n). The bit-line controller element 8(1) includes, in general, a reading circuit 8b, a writing circuit 8c, a sense amplifier 8d, a bit-line discharging circuit 8e, and a bit-line charging circuit 8f. The reading circuit 8b is activated upon receiving a reading signal RT output from an array controller 8a, thereby to drive data buses DT and /DT in response to the signals of the bit lines BL and /BL. The writing circuit 8c is activated upon receiving a writing signal WT output from the array controller 8a, thereby to drive the bit lines BL and /BL in response to the signals of the data buses DT and /DT.

The sense amplifier 8d is activated upon receiving a sense-amplifier enable signal SE and /SE output from the array controller 8a, so as to amplify the difference of potentials between the bit lines BL and /BL, thereby setting one of the potentials of the bit lines to the high level potential and the other one to the low level potential.

The bit-line discharging circuit 8e is activated upon receiving a discharge-control signal BLL with the high level potential output from the array controller 8a, thereby to discharge the bit lines BL and /BL. Also, the bit-line charging circuit 8f is activated upon receiving a charge-control signal BLH with the high level potential output from the array controller 8a, thereby to charge the bit lines BL and /BL.

The sense-amplifier control circuit C5 includes three AND gates 12s, 12u and 12v with two inputs and an OR gate 12t with two inputs. One of the inputs of the AND gate 12s is connected to a reset signal input terminal 12z through an inverter 12w. The other one of the inputs of the AND gate 12s is connected to the output of the sense-amplifier enable signal /SE of the array controller 8a. One of inputs of the OR gate 12t is connected to the reset signal input terminal 12z, and the other one of inputs of the OR gate 12t is connected to the output of the sense-amplifier enable signal SE of the array controller 8a. One of the inputs of the AND gate 12u is connected to the reset signal input terminal 12z through the inverter 12w, and the other one of the inputs of the AND gate 12u is connected to the output of the discharge-control signal BLL of the array controller 8a. One of the inputs of the AND gate 12v is connected to the reset signal input terminal 12z through the inverter 12w, and the other one of the inputs of the AND gate 12v is connected to the output of the charge-control signal BLH of the array controller 8a.

According to the sense-amplifier control circuit C5 so structured, upon receiving the reset signal with the high level potential, the sense-amplifier enable signals SE and /SE are switched to high and low level potentials, respectively, and both of the discharge-control signal BLL and the charge-control signal BLH are set to the low level potential.

Figure 9:
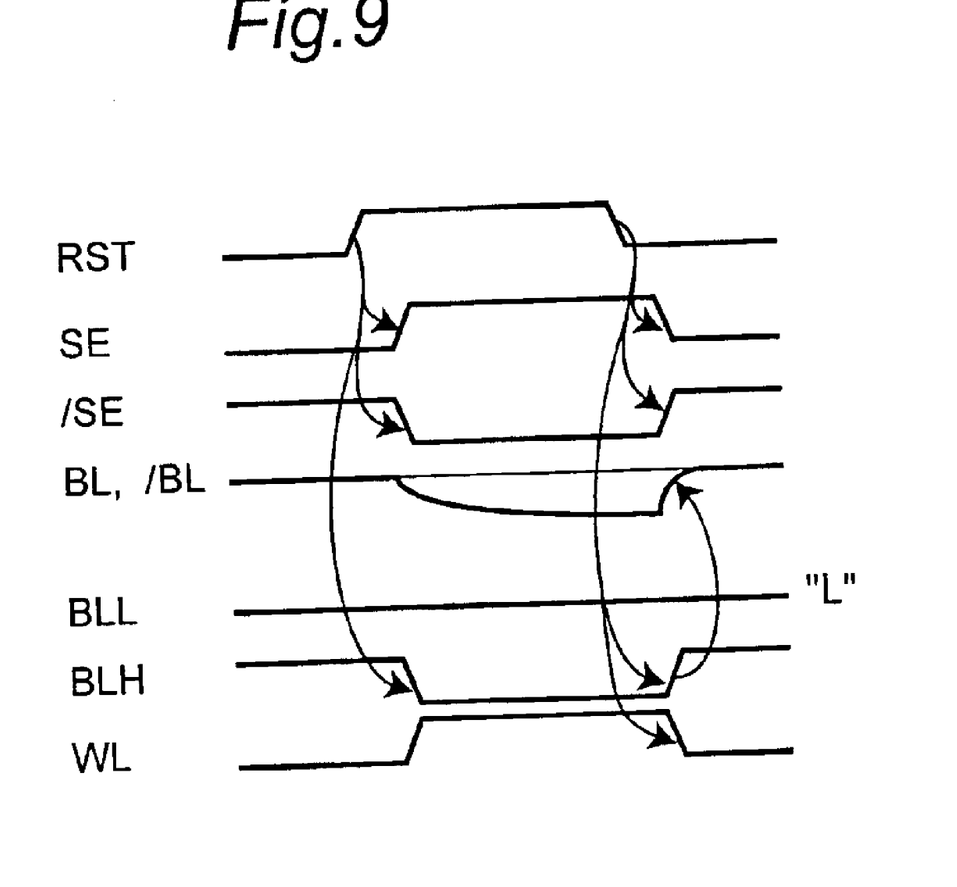
FIG. 9 is a timing chart showing the potential levels of the sense-amplifier enable signal, the bit lines, the discharge-control signal and the charge-control signal, and the signals of the word lines of the memory-cell initializing circuit.

FIG. 9 is a timing chart showing the potential levels of the sense-amplifier enable signal SE and /SE, the bit lines BL and /BL, the discharge-control signal BLL, the charge-control signal BLH, and the word-line signals WL1 to WLm. Each of the signals outputs from the memory-cell initializing circuit 12" upon receiving the reset signal with the high level potential. As shown in FIG. 9, after outputting the reset signal RST with the high level potential, the word-line signals WL1 to WLm can be switched to the high level potential, and the bit-line signals BL and /BL can be switched to the high and low level potentials, respectively. This fully discharges the data-storing capacitors 31 provided adjacent to the bit lines /BL, and secures the inhibition of the through current between the bit lines BL and /BL.

As described above, the memory cell has the data-storing capacitor used for storing the datum with the cell plate, of which potential is increased when applied with the source voltage. Then, the memory node potential may also be raised together with the increased data-storing capacitor potential due to the coupling effect of the data-storing capacitor, thereby to cause the corresponding transistor in ON-state and the through current running between the bit lines BL and /BL. However, the memory device according to the present invention includes the memory-cell initializing circuit, which prevents the through current so that the malfunctions such as data misreading in the data reading process are eliminated.

What is claimed is:

1. A dynamic associative memory device, comprising:
   a word line;
   a pair of first bit line (BL) and second bit line (/BL) which has signal potentials opposite to the first bit line;
   a plurality of memory cells, wherein each of the memory cells includes;
      a data-storing capacitor connected to the first bit line or the second bit line through first transmission gate capable of being switched to ON-state in accordance with an activation of the word line, and having a cell plate supplied with a source voltage; and
      at least one second transmission gate provided in series between the first bit lines and the second bit line, capable of being switched to ON-state in response to a memory node potential at an opposite side of a source voltage supply-side of the data-storing capacitor; and
   a memory cell initializing circuit for controlling the memory node potential upon receiving a reset signal so that at least one of the second transmission gates is switched to OFF-state.

2. The dynamic associative memory device according to claim 1,
   wherein said memory cell initializing circuit activates the word line and controls the memory node potential upon receiving the reset signal so that at least one of the second transmission gate is switched to OFF-state.

3. The dynamic associative memory device according to claim 1,
   wherein the memory-cell initializing circuit sets the memory-node potential to 0 volt upon receiving the reset signal.

4. A dynamic associative memory device, comprising:
   a word line;
   a pair of first bit line (BL) and second bit line (/BL) which has signal potentials opposite to the first bit line;
   a sense-amplifier to amplify the difference of potentials between the first bit lines and the second bit line;
   a plurality of memory cells, wherein each of the memory cells includes;
      first and second data-storing capacitor connected to the first bit line and the second bit line through each of two first transmission gates each capable of being switched to ON-state in accordance with an activation of a word line, and having a cell plate supplied with a source voltage; and
      two second transmission gates provided in series between the first bit lines and the second bit line, of which each gate is connected to a memory node that is an opposite side node of a source voltage supply-side node of the first and second data-storing capacitor each capable of being switched to ON-state in response to the memory node potential; and
   a memory cell initializing circuit for controlling the memory node potential by activating the word line and the sense-amplifier upon receiving a reset signal so that at least one of the second transmission gates is switched to OFF-state.

5. The dynamic associative memory device according to claim 4,
   wherein the memory-cell initializing circuit sets one of the memory-node potentials to 0 volt upon receiving the reset signal.

* * * * *